United States Patent

McCann et al.

[15] 3,699,402

[45] Oct. 17, 1972

[54] HYBRID CIRCUIT POWER MODULE

[72] Inventors: Joseph A. McCann, Auburn; John D. Harnden, Jr., Schenectady, both of N.Y.

[73] Assignee: General Electric Company

[22] Filed: July 27, 1970

[21] Appl. No.: 58,273

[52] U.S. Cl...............317/235 R, 307/257, 307/305, 307/321, 317/234 E, 317/234 F, 317/235 AB, 317/235 AJ

[51] Int. Cl...........................H01l 11/00, H01l 15/00

[58] Field of Search...307/305, 321, 257; 317/235 E, 317/235 F, 235 H, 235 N, 235 W, 235 D, 235 AA, 235 AB, 235 AJ

[56] References Cited

UNITED STATES PATENTS

| | | | |
|---|---|---|---|
| 2,958,808 | 11/1960 | Miller | 307/321 |
| 3,018,414 | 1/1962 | Albright | 317/11 E |
| 3,199,002 | 8/1965 | Martin | 317/235 |
| 3,348,105 | 10/1967 | Doyle | 317/235 |
| 3,383,760 | 5/1968 | Shwartzman | 317/234 |
| 3,462,655 | 8/1969 | Coblenz | 317/234 |
| 3,463,970 | 8/1969 | Gutzwiller | 317/234 |
| 3,549,905 | 12/1970 | Johnson | 307/257 |
| 3,466,510 | 9/1969 | Maute | 29/589 X |

*Primary Examiner*—James D. Kallam
*Assistant Examiner*—Andrew J. James
*Attorney*—Robert J. Mooney, Nathan J. Cornfeld, Carl O. Thomas, Frank L. Neuhauser, Oscar B. Waddell and Joseph B. Forman

[57] ABSTRACT

A hybrid circuit is formed on an electrically insulative, thermally conductive substrate surface with an alternating current inverter bridge having associated therewith a switching serving diode. In one form the bridge and the switch serving diode are integrated within a single semiconductive element while in another form the switch serving diode may be integrated into a thyristor semiconductive element so that the thyristor has no reverse current blocking capability.

18 Claims, 9 Drawing Figures

INVENTORS:
JOSEPH A. McCANN,
JOHN D. HARNDEN, JR.

BY Carl O. Thomas
THEIR ATTORNEY.

INVENTORS:
JOSEPH A. McCANN,
JOHN D. HARNDEN, JR.
BY Carl O. Thomas
THEIR ATTORNEY.

HYBRID CIRCUIT POWER MODULE

Our invention relates to a module for inverting an electrical power supply and for providing a unidirectional switch serving diode.

A number of power handling circuits are known to the art which incorporate the circuit relationships shown in FIG. 1. In the circuit 100 shown, an alternating current source 102 is connected across the input terminals 104 and 106 of a full wave inverter bridge 108. The input terminals of the bridge are both joined to the positive output bridge terminal 110 by rectifier diodes 112 and 114 having their anodes associated with the input terminals and their cathodes associated with the positive output terminal. In a similar manner rectifier diodes 116 and 118 extend between the input terminals and the output terminal 120, but with their anodes being associated with the negative output terminal and their cathodes being associated with the input terminals. The negative output terminal 120 of the bridge is conductively connected to a negative load terminal 122. The positive output terminal is connected to the positive load terminal 124 through a switch 126. In its most common form the switch may be comprised of one or more active semiconductor devices. For example, the switch may be an SCR having its anode connected to the positive output bridge terminal and its cathode connected to the positive load terminal 124. The SCR may be controlled by avalanche or gate circuit arrangements, as is generally well understood in the art. It is to be noted that the bridge does not provide a continuous supply of direct current to the switch. Twice during each alternating current cycle the direct current output approaches zero. In the case of an SCR this means that twice during each cycle the current through the SCR drops below the holding current and conduction through the SCR must be again initiated by either gate or avalanche triggering. Where an inductance is included in the load placed across the terminals 122 and 124, at the beginning of each half cycle the SCR anode may be negatively biased as compared to its cathode. In order to avoid the undesirable effect of having a reverse bias placed on an SCR with an inductive load it is common practice to shunt the SCR in the reverse direction with a diode. This is shown in FIG. 1 by diode 128 having its cathode connected to the positive output terminal and its anode connected to the positive load terminal.

From the foregoing it is apparent that the circuit 100 requires a minimum of five functional diodes and a switch. Accordingly, if each function is performed by a discrete semiconductor device, six devices or modules must be provided for in circuit design and assembly. Recognizing the disadvantages in space utilization, assembly effort, and cost it has heretofore been proposed to integrate the bridge diodes into an integrated device or module. Such arrangements are disclosed, for example, by Shwartzman in U.S. Pat No. 3,383,760, by Coblenz in U.S. Pat No. 3,462,655, and by McCann in copending patent application Ser No. 58,271, title Integrated Semiconductor Rectifiers and Processes for their Fabrication and Ser No. 58,272, now Pat No. 3,654,524, titled Unitary Full Wave Inverter, both McCann applications being filed on even date with this application. It is to be noted, however, that even if all the bridge diodes are integrated, the circuit 100 still requires three separate devices or modules for fabrication by conventional techniques.

It is accordingly an object of our invention to provide a unitary power module capable of performing the functions of a full wave bridge and a switch serving diode.

It is a more specific object of our invention to provide a unitary power module capable of performing the functions of a full wave bridge, a switch, and a switch serving diode in which the bridge diodes are integrated and the shunting diode is integrated with either the switch or the bridge.

These and other objects of our invention are accomplished in one aspect by a hybrid circuit power module comprised of thermally conductive substrate means providing an electrically insulative major surface. A power inverter is mounted in thermally conductive relation on the substrate means surface including first and second laterally spaced electrically conductive output contact means. Third and fourth laterally spaced electrically conductive input contact means are provided each having a portion overlying both of the first and second contact means and spaced therefrom. Semiconductor bridge means provide unidirectional current paths between the first contact means and the third and fourth contact means and provide oppositely directed unidirectional current paths between the second contact means and the third and fourth contact means. One of the input and output contact means is interposed between and provides a thermally conductive path between the semiconductor bridge means and the substrate means. Semiconductor switch serving means provides a unidirectional current path. Fifth and sixth contact means are conductively associated with the semiconductor switch serving means, and one of the fifth and sixth contact means is associated with the semiconductor switch serving means providing a thermally conductive path between the semiconductor switch serving means and the substrate means.

Our invention may be better understood by reference to the following detailed description considered in conjunction with the drawings, in which FIG. 1 is a diagram of a circuit of a type generally known to the art including a full wave bridge, a switch, and a switch shunting diode;

Figure 7:
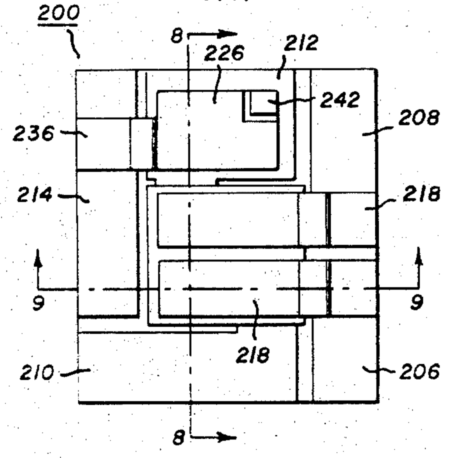
Figure 8:
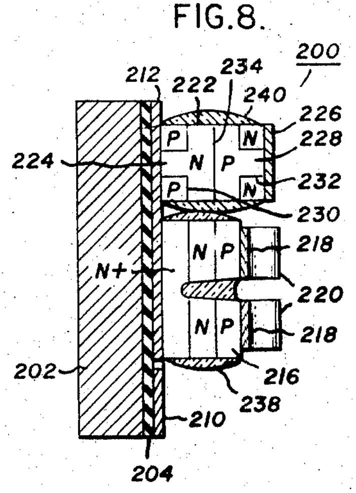
Figure 9:
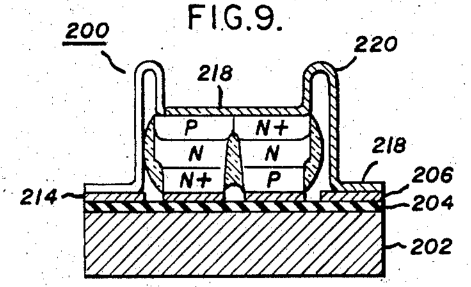
Figure 3:
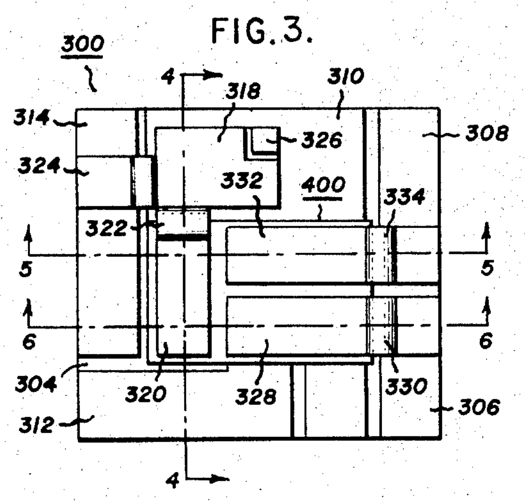
FIG. 3 is a plan view of a hybrid circuit power module according to our invention.
Figure 4:
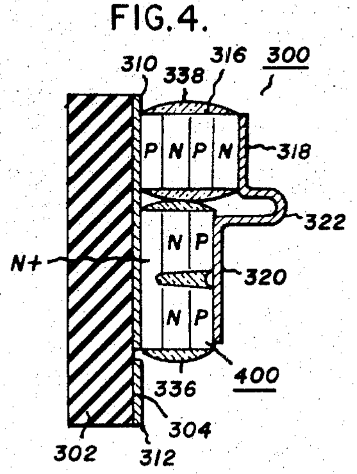
Figure 5:
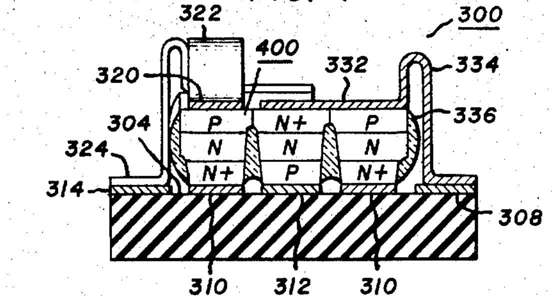
Figure 6:
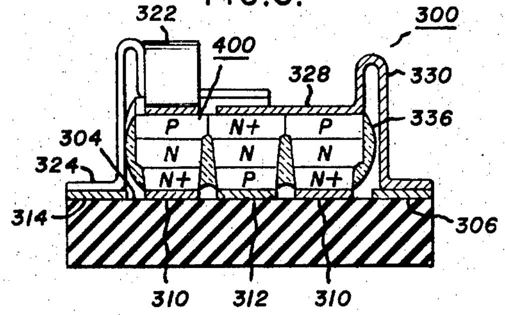

FIGS. 4, 5, and 6 are sectional views taken along section lines 4—4, 5—5, and 6—6, respectively, in FIG. 3;

FIG. 7 is a plan view of a modified hybrid circuit power module according to our invention; and FIGS. 8 and 9 are sectional views taken along section lines 8—8 and 9—9, respectively, in FIG 7.

In FIGS. 3 through 6 inclusive a hybrid circuit power module 300 is shown comprised of a substrate 302 formed of an electrically insulative, thermally conductive material, such as beryllia, alumina, aluminum nitride, boron nitride, etc. The substrate provides an electrically insulative major surface 304 on which a plurality of contacts are located in laterally spaced relation. These contacts are first input contact 306, a second input contact 308, a first output contact 310, a second output contact 312, and a switch output contact 314. By reference to the drawings, particularly FIGS. 3, 5, and 6, it is apparent that the first output contact 310 is laterally spaced from the second output contact 312 on three sides thereof.

Figures 1, 2:
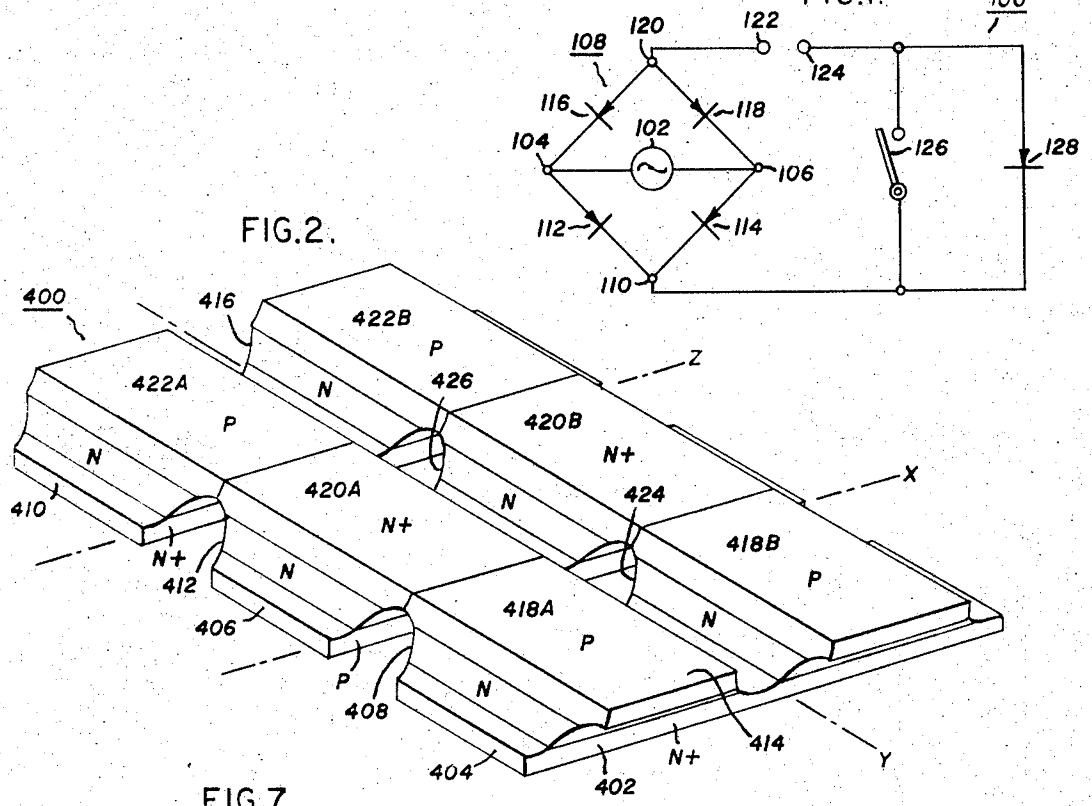
FIG. 2 is an isometric view of a semiconductive element according to our invention.

A unitary semiconductive element 400 overlies the first and second output contacts. The structure of the semiconductive element 400 may be best appreciated by reference to FIG. 2. The semiconductive element is comprised of a first zone 402 of $N^+$ conductivity type lying adjacent a first major surface 404. A second zone 406 of P conductivity type also lies adjacent the first major surface and is laterally spaced from the first zone by a first groove 408 opening toward the first major surface. A third zone 410 of $N^+$ conductivity type also lies adjacent the first major surface and is laterally spaced from the second zone by a second groove 412 which opens toward the first major surface. A fourth zone of P conductivity type lies adjacent a second major surface 414 and is divided by a third groove 416 opening toward the second major surface into two segments 418A and 418B each overlying the first zone and forming separate rectifying junctions therewith. A fifth zone similarly lies adjacent the second major surface and is divided by the third groove into two segments 420A and 420B. The fifth zone is of $N^+$ conductivity type and each segment thereof forms a separate rectifying junction with the second zone. A sixth zone of P conductivity type is divided by the third groove into two segments 422A and 422B each of which form rectifying junctions with the third zone. The first and third grooves intersect to form an aperture 424 while the second and third grooves intersect to form an aperture 426.

Noting FIGS. 5 and 6 it can be seen that the first and third zones overlie portions of the first output contact. The second zone overlies a portion of the second output contact. The first and second output contacts not only provide electrically conductive contact with the first, second, and third zones, but also provide a thermally conductive path from the semiconductive element 400 to the substrate. Additionally it can be seen that both the first and second output contacts extend laterally from beneath the semiconductive element 400 to facilitate external lead attachments to the contacts of the module.

A thyristor semiconductive element 316 is shown in FIGS. 3 and 4 as overlying the first output contact. The thyristor semiconductive element includes a PNPN sequence of serially related layers within a single crystal with the endmost P layer or anode emitter layer being bonded to the first output contact. Overlying the endmost N layer or cathode emitter layer of the thyristor element is a shunt connector 318 having an integral strap portion 320 extending laterally to overlie and provide an electrical attachment to the segments of the sixth zone of the semiconductive element 400. In order to minimize stress transmission between the semiconductive elements through the strap portion a stress relief oxbow 322 is provided. The shunt connector is also provided with a second strap portion 324 which is preferably also provided with a stress relief oxbow and which provides an electrical interconnection between the cathode emitter layer of the thyristor semiconductive element and the switch output contact 314. A gate contact 326 is laterally spaced from the shunt connector and is associated with the internal P layer or cathode base layer of the thyristor semiconductive element. Although not visible in the drawings, a portion of the cathode base layer extends to the surface of the thyristor element remote from the substrate over an area roughly co-extensive with the gate contact in a manner well known to the art. The first segments of the fourth and fifth zones are electrically conductively associated with the first input contact by a connector strap 328 fastened to the first segments of the fourth and fifth zones at one extremity and fastened to the first input contact at its opposite extremity with a stress relief oxbow 330 being provided mediate its points of interconnection. In a similar manner a strap 332 having a mediate oxbow 334 is provided to electrically interconnect the second segments of the fourth and fifth zones with the second input contact.

A protective passivant body 336 is located within the grooves of and peripherally surrounds the semiconductive element to encompass the surface areas of the semiconductive element which are intersected by the edges of the rectifying junctions. In a preferred form the protective passivant together with the associated contacts and connectors completely encapsulate the semiconductive element. Where the protective passivant is formed of a material such as glass that is highly impervious to external contaminants, no other packaging material may be required to protect the semiconductive element. Instead of using glass as protective passivant material, oxides, nitrides, silicone resins and varnishes, epoxy resins, and other conventional passivants may be substituted. The thyristor semiconductive element is shown provided with a protective passivant body 338, which may be chosen similarly as that from the semiconductive element 400. If desired, additional protective packaging, not shown, may be utilized to further protect the semiconductive elements.

In use, it can be seen that the module 300 performs the circuit functions of the rectifier bridge 108, switch 126, and shunting diode 128 in circuit 100. Thus, all the power handling portions of the circuit, except for the load, are associated in a single module that can be conveniently mounted on a chassis or heat sink for heat dissipation. The substrate is supplied heat from the thyristor and bridge semiconductive elements through the first and second output contacts which provide a low impedance thermal interconnection therebetween. The substrate in turn rejects heat to the member on which it is mounted while at the same time keeping the module elements electrically decoupled therefrom. In the module the second output contact 312 may serve as the negative load terminal 122 while the switch output contact 314 may serve as the positive load terminal 124. Where it is desired to place the load in the circuit between the switch 126 and the positive bridge terminal 110, rather than the negative bridge terminal 120, as shown, it is merely necessary to form the semiconductive element 400 so that it is the electrical complement of the form shown. That is, the first, third, and fifth zones would be formed of P conductivity type while the second, fourth, and sixth zones would be formed of $N^+$ conductivity type.

In the hybrid circuit power module 300 it is to be noted that the shunting diode 128 is integrated into the semiconductive element in the form of the third and sixth zones. While the sixth zone is divided into segments by the third groove, there is no necessity of grooving the sixth zone. Grooving of the sixth zone is shown merely because this in most manufacturing approaches is easier than taking steps to limit the extent of the third groove. It is also appreciated that only one half of the third and sixth zones may be utilized to form the shunting diode. For example, in FIG. 2 the portion of the semiconductive element lying either to the right or the left of the Y axis and behind the Z axis may be removed.

We further recognize that it is not necessary to the practice of our invention to integrate the shunting diode into the semiconductive element 400. If the semiconductive element 400 were sub-divided in FIG. 2 along the Z axis, the portion of the element lying in front of the Z axis would form an integrated full wave bridge element. The shunting diode could then be separately provided. A preferred form for incorporating the shunting diode exterior of the bridge element is to integrate the shunting diode into the thyristor semiconductive element.

The hybrid circuit power module 200 shown in FIGS. 7 through 9 inclusive represents a preferred embodiment of such a module. As shown, an electrically and thermally conductive substrate formed of a metal, such as copper or aluminum, is provided with a layer 204 of a thermally conductive, electrically insulative material as previously described in connection with substrate 302. Additionally, the layer 204 may take the form of a thin layer of an electrically insulative resin, such as Teflon, Mylar, epoxy resins, etc. Onto the electrically insulative surface provided by the layer 204 are positioned laterally spaced input contacts 206 and 208, negative bridge output contact 210, positive bridge output contact 212, and switch output contact 214. The bridge semiconductive element 216 corresponds to the portion of the semiconductive element 400 shown in FIG. 2 lying in front of the Z axis. Applying zone designations as previously set forth, the first zone overlies and is electrically and thermally conductively bonded to the positive bridge output contact 212 while the second zone is similarly related to the negative bridge output contact 210. Identical laterally spaced connectors 218 each including an oxbow 220 interconnect one segment of each of the fourth and fifth zones (in this case the third and fourth zones present in the semiconductive bridge element) to the bridge input contacts.

The thyristor semiconductive element 222 is laterally spaced from the bridge semiconductive element and overlies in electrically and thermally conductive relation a portion of the positive bridge output contact. The thyristor semiconductive element is comprised of a PNPN sequence of serially related zones. The endmost P conductivity type zone is electrically conductively associated with the positive bridge output contact. Also, a limited portion of the intermediate N conductivity type layer as shown at 224 extends to this contact. A connector 226 is electrically conductively associated with the endmost N conductively type layer and also to a limited portion of the intermediate P conductivity type layer at 228. It is accordingly apparent that the anode emitter junction 230 of the thyristor semiconductive element is shunted by the positive bridge output contact while the cathode emitter junction 232 is similarly shunted by the connector 226. This leaves only the collector junction 234 of the thyristor element unshunted. The connector 226 includes a strap portion 236, which may include an oxbow for stress relief, providing an electrical interconnection to the switch output contact. Protective passivant bodies 238 and 240 surround the semiconductive bridge and thyristor elements in the module 200 similarly as in the module 300. A gate contact 242 is associated with a portion of the intermediate P conductivity type layer, not shown, in a conventional manner.

The hybrid circuit power module 200 is mounted and utilized in the same general manner as the module 300. The important difference is that the bridge semiconductive element 216 makes no provision for a switch shunting diode, since this feature is now integrated into the thyristor semiconductive element. Should an inductive load tend to place a reverse bias on the thyristor element, it is apparent that by reason of the intermediate N conductivity type layer having a portion 224 conductively associated with the contact 212 and the intermediate P conductivity type layer having a portion 228 lying in contact with the connector 226, only the collector junction 234 separates the positive bridge output contact from the switch output contact. Upon any tendency toward reverse bias of the thyristor, however, the collector junction is forward biased and therefore conducting. Hence the thyristor semiconductive element as formed contains no appreciable reverse voltage blocking capability and is the functional equivalent of a conventional SCR, which has an appreciable reverse blocking capability, and a separate shunting diode.

In the circuit 100 the diode 128 serves the useful circuit function of shunting the switch 216. It is appreciated that it is also conventional practice to locate switch serving diodes at other circuit locations. For example, instead of locating the switch serving diode 128 so that it shunts the switch, the serving diode may be located to shunt the load. In such instance and anode of the diode is connected to the terminal 122 and the cathode of the diode is connected to terminal 124. In this location the serving diode functions to minimize circuit transients which may be produced by switching. Such a diode when employed with reactive loads is frequently referred to as a free wheeling diode.

It is apparent that the module 300 may be readily modified to utilize the serving diode incorporated in the semiconductive element 400 as a free wheeling diode. To accomplish this it is merely necessary to replace the electrical connection of the first and third zones with an electrical interconnection of the third zone and the switch output contact 314. The electrical interconnection of the sixth zone with the cathode of the thyristor element is replaced by an electrical interconnection of the sixth zone with the second zone. Modification of the module 300 to place the serving diode and load terminals between the bridge and thyristor element anode could in view of the above teaching be readily accomplished by one skilled in the art.

Another manner in which the serving diode may be utilized to facilitate switching is to connect the serving diode in series with the thyristor and load with its polarity of interconnection being chosen so that it passes current in the same direction as the thyristor. When the serving diode is connected in this manner it introduces into the circuit a small forward voltage drop in series with the thyristor. Where the input frequency to the bridge is high the periodic potential drop across the thyristor may be of insufficient duration to allow the thyristor to turn off. By placing the serving diode in series with the thyristor the time interval during which the potential across the thyristor is below the holding value can be increased and assurance that the thyristor will turn off twice during each input cycle is increased. Alternately viewed, the acceptable turn off time tolerances assigned to the thyristor for a given frequency application can be relaxed as a result of incorporating the serving diode. To achieve such a circuit placement of the serving diode in the module 300 it is merely necessary to replace the electrical interconnection of the first zone and the thyristor anode with an electrical interconnection of the first zone with the sixth zone. The electrical interconnection of the sixth zone with the thyristor cathode is, of course, omitted. The electrical interconnection of the third zone with the thyristor anode is left undisturbed. Thus, the serving diode is interposed in series with the load between the thyristor anode and the positive terminal of the bridge. Similar placements of the serving diode between the thyristor and load or between the load and bridge would in view of the above teaching be readily accomplished by one skilled in the art.

While we have described our invention with reference to certain preferred embodiments, it is appreciated that numerous variations will readily occur to those skilled in the art. For example, instead of using an integrated bridge semiconductive element as disclosed, it is possible to utilize a plurality of discrete semiconductive elements, preferably joined into a single unit by a common protective passivant material, as disclosed by the Shwartzman patent noted above. For example, the semiconductive element 400 could be divided along the X, Y, and Z axes and the resulting discrete elements individually mounted. Instead of being separated by weakly doped central N conductivity type regions, the zones of the bridge semiconductive elements may be separated by weekly doped P conductivity type regions or substantially intrinsic regions or the inclusion of a central region separating the P and $N^+$ conductivity type regions may be omitted entirely. Instead of mounting the bridge output contacts adjacent the substrate surfaces, it would involve no more than ordinary mechanical skill to invert the semiconductive elements, so that the input bridge contacts lie adjacent the substrate and the output bridge contacts overlie the semiconductive elements. Still other variations will readily occur. It is accordingly intended that the scope of our invention be determined by reference to the following claims.

What we claim and desire to secure by Letters Patent of the United States is:

1. A hybrid circuit power module comprising
thermally conductive substrate means providing an electrically insulative major surface;
a power inverter mounted in thermally conductive relation on said substrate means surface including
first and second laterally spaced electrically conductive output contact means,
third and fourth laterally spaced electrically conductive input contact means each having a portion overlying both of said first and second contact means and spaced therefrom,
semiconductor bridge means for providing unidirectional current paths between said first contact means and said third and fourth contact means and for providing oppositely directed unidirectional current paths between said second contact means and said third and fourth contact means,
said semiconductor bridge being formed in an integrated circuit having a first groove opening toward said output contact means and a second groove opening toward said input contact means,
a first zone of a first conductivity type lying adjacent said first contact means and bounded on one edge by said first groove,
a second zone of a second conductivity type lying adjacent said second contact means and separated from said first zone by said first groove,
a third zone of said second conductivity type overlying said first zone to form a rectifying junction therewith, said third zone being divided by the second groove into two laterally spaced segments,
a fourth zone of said first conductivity type overlying said second zone to form a rectifying junction therewith, said fourth zone being divided by the second groove into two laterally spaced segments,
one of said input and output contact means being interposed between and providing a thermally conductive path between said semiconductor bridge means and said substrate means,
semiconductor switch serving means for providing a unidirectional current path,
fifth and sixth contact means conductively associated with said semiconductor switch serving means, and
one of said fifth and sixth contact means associated with said semiconductor switch serving means providing a thermally conductive path between said semiconductor switch serving means and said substrate means.

2. A hybrid circuit power module according to claim 1 in which said semiconductor bridge means and said semiconductor switch serving means are formed of a single monocrystalline semiconductive element.

3. A hybrid circuit power module according to claim 1 additionally including a switch, one of said contact means being conductively associated with said switch and interposed between said switch and said substrate means to provide a thermally conductive path therebetween.

4. A hybrid circuit power module according to claim 1 additionally including a switch, said switch being comprised of a thyristor semiconductive element, one of said contact means being conductively associated with said thyristor semiconductive element and interposed between said switch and said substrate means to provide a thermally conductive path therebetween.

5. A hybrid circuit power module according to claim 1 in which one of said contact means associated with said switch serving means is conductively associated with one of said output contact means.

6. A hybrid circuit power module according to claim 1 in which one of said contact means is spaced from said substrate means and includes a connector strap.

7. A hybrid circuit power module according to claim 1 in which at least one of said contact means is spaced from said substrate means and includes connector strap means for dissipating lateral stress.

8. A hybrid circuit power module according to claim 1 in which one of said contact means is spaced from said substrate means and includes a connector strap having a stress relief ox bow formed therein.

9. A hybrid circuit power module according to claim 1 additionally including protective passivant means associated with said semiconductor bridge means and said semiconductor switch shunting means and cooperating with said contact means for encapsulation of semiconductor bridge means and switching shunting means.

10. A hybrid circuit power module according to claim 1 in which said substrate means is formed of a thermally conductive, electrically insulative material.

11. A hybrid circuit power module according to claim 1 in which said substrate means is formed of a base of thermally and electrically conductive material having a coating of thermally conductive, electrically insulative material supported thereon to form said surface.

12. A hybrid circuit power module comprising thermally conductive substrate means providing an electrically insulative major surface, a power inverter mounted in thermally conductive relation on said substrate means surface including first and second laterally spaced electrically conductive output contact means, third and fourth laterally spaced electrically conductive input contact means each having a portion overlying both of said first and second contact means and spaced therefrom, semiconductor bridge means for providing unidirectional current paths between said first contact means and said third and fourth contact means and for providing oppositely directed unidirectional current paths between said second contact means and said third and fourth contact means, and one of said input and said output contact means being interposed between and providing a thermally conductive path between said semiconductor bridge means and said substrate means, semiconductor switch shunting means for providing a unidirectional current path around a switch, said shunting means being conductively associated with one of said output contact means to provide a unidirectional current path through said shunting means, all of said unidirectional current paths previously recited joined by said output contact means associated with said shunting means being like directed, and said shunting means including a contact means for interconnection with one terminal of the switch, one of said contact means associated with said semiconductor switch shunting means being interposed between and providing a thermally conductive path between said shunting means and said substrate means, and said output contact means associated with said shunting means providing a means for interconnecting to a remaining terminal of the switch.

13. A hybrid circuit power module comprising thermally conductive substrate means providing an electrically insulative major surface, a power inverter mounted in thermally conductive relation on said substrate means surface including first and second laterally spaced electrically conductive output contact means, third and fourth laterally spaced electrically conductive input contact means each having a portion overlying both of said first and second contact means and spaced therefrom, semiconductor bridge means formed of a monocrystalline semiconductive element having a first groove opening toward said output contact means and a second groove opening toward said input contact means, a first zone of a first conductivity type lying adjacent said first contact means and bounded on one edge by said first groove, a second zone of a second conductivity type lying adjacent said second contact means and separated from said first zone by the first groove, a third zone of said second conductivity type overlying said first zone to form a rectifying junction therewith, said third zone being divided by the second groove into two laterally spaced segments, and a fourth zone of said first conductivity type overlying said second zone to form a rectifying junction therewith, said fourth zone being divided by the second groove into two laterally spaced segments, and one of said input and said output contact means being interposed between and providing a thermally conductive path between said semiconductor bridge means and said substrate means, semiconductor switch shunting means for providing a unidirectional current path around a switch, said shunting means being conductively associated with one of said output contact means to provide a unidirectional current path through said shunting means, all of said unidirectional current paths previously recited joined by said output contact means associated with said shunting means being like directed, and said shunting means including a contact means for interconnection with one terminal of the switch, one of said contact means associated with said semiconductor switch shunting means being interposed between and providing a thermally conductive path between said shunting means and said substrate means, and said output contact means associated with said shunting means providing a means for interconnecting to a remaining terminal of the switch.

14. A hybrid circuit power module comprising thermally conductive substrate means providing an electrically insulative major surface, first and second laterally spaced electrically conductive output contact means, third and fourth laterally spaced electrically conductive input contact means each having a portion overlying both of said first and second contact means and spaced therefrom, fifth contact means laterally spaced from said first and second contact means, sixth contact means laterally spaced from said third and fourth contact means and having a portion overlying said fifth contact means, a monocrystalline semiconductive element having first and second opposed major surfaces, having first and second laterally spaced grooves opening toward said first major surface, and having a third groove opening toward said second major surface and intersecting both the first and second grooves comprised of a first zone of a first conductivity type associated with said first contact means and bounded on one edge by the first groove, a second zone of a second conductivity type associated with said second contact means and bounded by the first and second grooves, a third zone of said first conductivity type associated with said fifth contact means and bounded on one edge by the second groove, a fourth zone of said second conductivity type overlying said first zone and forming a rectifying junction therewith, said fourth zone being divided by the third groove into two segments, each of said fourth zone segments being associated with a separate one of said input contact means, a fifth zone of said first conductivity type overlying said second zone and forming a rectifying junction therewith, and being divided by the third groove into two segments, each of said fifth zone segments being associated with a separate one of said input contact means, a sixth zone of said second conductivity type overlying said third zone and forming a rectifying junction therewith and being conductively associated with said sixth contact means, and said first, second, and fifth contact means lying along said first major surface and said third, fourth, and sixth contact means lying along said second major surface, and said contact means associated with one of said major surfaces of said semiconductive element providing a low impedance thermally conductive path from said semiconductive element to said substrate means.

15. A hybrid circuit power module according to claim 14 additionally including a switch conductively associated with one of said contact means and lying in thermally conductive relation to said substrate means.

16. A monocrystalline semiconductive element having first and second opposed major surfaces, having first and second laterally spaced grooves opening toward said first major surface, and having a third groove opening toward said second major surface comprised of a first zone of a first conductivity type lying adjacent said first major surface and bounded on one edge by the first groove, a second zone of a second conductivity type lying adjacent said first major surface and bounded by the first and second grooves, a third zone of said first conductivity type lying adjacent said first major surface and bounded on one edge by the second groove, a fourth zone of said second conductivity type overlying said first zone and forming a rectifying junction therewith, said fourth zone being divided by the third groove into two segments, a fifth zone of said first conductivity type overlying said second zone and forming a rectifying junction therewith, said fifth zone being divided by the third groove into two segments, and a sixth zone of said second conductivity type overlying said third zone and forming a rectifying junction therewith.

17. The combination comprising a monocrystalline semiconductive element according to claim 16, first, second and fifth contact means conductively associated with said first, second, and third zones, respectively, third and fourth contact means each being conductively associated with a separate one of said segments of said fourth and fifth zones, said segments associated with each of said third and fourth contact means being contiguous, sixth contact means being conductively associated with said sixth zone, and protective passivant means associated with said semiconductive element and cooperating with said contact means to encapsulate said semiconductive element.

18. A hybrid circuit power module comprising thermally conductive substrate means providing an electrically insulative major surface, a power inverter mounted in thermally conductive relation on said substrate means surface including first and second laterally spaced electrically conductive output contact means, third and fourth laterally spaced electrically conductive input contact means each having a portion overlying both of said first and second contact means and spaced therefrom, semiconductor bridge means for providing unidirectional current paths between said first contact means and said third and fourth contact means and for providing oppositely directed unidirectional current paths between said second contact means and said third and fourth contact means, and one of said input and output contact means being interposed between and providing a thermally conductive path between said semiconductor bridge means and said substrate means, semiconductor thyristor element means comprised of an endmost layer of N conductivity type, an intermediate layer of P conductivity type, an intermediate layer of N conductivity type, and an endmost layer of P conductivity type, said layers being consecutively arranged, first thyristor contact means conductively associated with one of said endmost layers and said intermediate layer adjacent thereto, second thyristor contact means conductively associated with a remaining of said endmost layers and said intermediate layer adjacent thereto, and one of said thyristor contact means providing a thermally conductive path from said thyristor element to said substrate means.

* * * * *